(12) United States Patent
Zhang et al.

(10) Patent No.: US 12,295,198 B2
(45) Date of Patent: May 6, 2025

(54) ORGANIC ELECTROLUMINESCENT DEVICE AND DISPLAY APPARATUS

(71) Applicant: BOE Technology Group Co., Ltd., Beijing (CN)

(72) Inventors: Xiaojin Zhang, Beijing (CN); Huiyun Yang, Beijing (CN); Yong Wu, Beijing (CN); Dan Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 726 days.

(21) Appl. No.: 17/635,705

(22) PCT Filed: Apr. 16, 2021

(86) PCT No.: PCT/CN2021/087868
§ 371 (c)(1),
(2) Date: Feb. 16, 2022

(87) PCT Pub. No.: WO2022/217600
PCT Pub. Date: Oct. 20, 2022

(65) Prior Publication Data
US 2023/0345752 A1 Oct. 26, 2023

(51) Int. Cl.
*H01L 51/50* (2006.01)
*H10K 50/12* (2023.01)
(Continued)

(52) U.S. Cl.
CPC ......... *H10K 50/121* (2023.02); *H10K 85/311* (2023.02); *H10K 85/6572* (2023.02);
(Continued)

(58) Field of Classification Search
None
See application file for complete search history.

(56) References Cited

U.S. PATENT DOCUMENTS

| | | |
|---|---|---|
| 2016/0315268 A1 | 10/2016 | Stoessel |
| 2021/0066636 A1 | 3/2021 | Baek et al. |

(Continued)

FOREIGN PATENT DOCUMENTS

| | | |
|---|---|---|
| CN | 105074950 A | 11/2015 |
| CN | 109524558 A | 3/2019 |

(Continued)

*Primary Examiner* — Gregory D Clark
(74) *Attorney, Agent, or Firm* — Ling Wu; Stephen Yang; Ling and Yang Intellectual Property

(57) ABSTRACT

The embodiments of the disclosure provide an organic electroluminescent device, including an anode, a cathode, an emitting layer arranged between the anode and the cathode, and an assistant luminescent layer located on one side, facing the anode, of the emitting layer. The assistant luminescent layer includes a first host material and a first fluorescent guest material. The emitting layer includes a second host material, a TADF material, and a second fluorescent guest material. The first host material and the first fluorescent guest material satisfy: S1(B)−T1(B)>0.2 eV; S1(B)>S1(C); T1(B)>T1(C); ||HOMO(B)−LUMO(C)|−S1(C)|≤0.2 eV. The lowest singlet state energy of the first host material is S1(B), and the lowest triplet state energy is T1(B). The lowest singlet state energy of the first fluorescent guest material is S1(C), and the lowest triplet state energy is T1(C).

20 Claims, 1 Drawing Sheet

(51) Int. Cl.
  *H10K 85/30* (2023.01)
  *H10K 85/60* (2023.01)
  *H10K 101/00* (2023.01)
  *H10K 101/25* (2023.01)
  *H10K 101/30* (2023.01)
  *H10K 102/00* (2023.01)

(52) U.S. Cl.
  CPC ..... *H10K 2101/25* (2023.02); *H10K 2101/30* (2023.02); *H10K 2101/90* (2023.02); *H10K 2102/351* (2023.02)

(56) References Cited

U.S. PATENT DOCUMENTS

2021/0391552 A1  12/2021  Liu et al.
2022/0416190 A1* 12/2022  Zhang .................. H10K 50/121

FOREIGN PATENT DOCUMENTS

| CN | 109599493 A | 4/2019 |
| CN | 109659442 A | 4/2019 |
| CN | 111640878 A | 9/2020 |
| CN | 111653679 A | 9/2020 |
| CN | 112234150 A | 1/2021 |
| CN | 112447921 A | 3/2021 |

* cited by examiner

ORGANIC ELECTROLUMINESCENT DEVICE AND DISPLAY APPARATUS

CROSS-REFERENCE TO RELATED APPLICATIONS

This application is a national stage application of PCT Application No. PCT/CN2021/087868, which is filed on Apr. 16, 2021, the contents of which are hereby incorporated by reference in their entirety.

TECHNICAL FIELD

Embodiments of the disclosure relate, but not limited, to the technical field of display, and in particular, to an organic electroluminescent device and a display apparatus.

BACKGROUND

A Thermally Activated Delayed Fluorescence (TADF) material is a third generation organic luminescent material developed after an organic fluorescent material and an organic phosphorescent material, which has been developed rapidly in recent years and has a good application potential in the technology of Organic Light-Emitting Diodes (OLEDs). A TADF sensitizer-based super-fluorescence technology is considered to be an implementation solution of the TADF material in the technology of OLEDs. However, at present, OLED devices using the TADF material face many problems, such as high working voltage, low efficiency, short service life, and so on of the devices.

SUMMARY

The following is a brief introduction for a host described herein in detail. The present brief introduction is not intended to limit the scope of protection of claims.

Embodiments of the disclosure provide an organic electroluminescent device, including an anode, a cathode, an emitting layer arranged between the anode and the cathode, and an assistant luminescent layer located on one side, facing the anode, of the emitting layer. The assistant luminescent layer includes a first host material and a first fluorescent guest material. The emitting layer includes a second host material, a TADF material, and a second fluorescent guest material.

the first host material and the first fluorescent guest material satisfy:

$S1(B)-T1(B)>0.2$ eV;

$S1(B)>S1(C)$;

$T1(B)>T1(C)$;

$||HOMO(B)-LUMO(C)|-S1(C)| \leq 0.2$ eV.

Herein, the lowest singlet state energy of the first host material is $S1(B)$, and the lowest triplet state energy is $T1(B)$; the lowest singlet state energy of the first fluorescent guest material is $S1(C)$, and the lowest triplet state energy is $T1(C)$; the highest occupied molecular orbital energy level of the first host material is $HOMO(B)$; and the lowest occupied molecular orbital energy level of the first fluorescent guest material is $LUMO(C)$.

The embodiments of the disclosure further provide a display apparatus, including the organic electroluminescent device as described in any one of the foregoing embodiments.

After the accompanying drawings and detailed descriptions are read and understood, other aspects may be understood.

BRIEF DESCRIPTION OF DRAWINGS

The accompanying drawings are used to provide further understanding of the technical solution of the disclosure, constitute a part of the description, and are used to explain the technical solution of the disclosure together with the embodiments of the disclosure, but do not constitute a limitation to the technical solution of the disclosure. The shape and size of the components in the accompanying drawings do not reflect true scale and are only intended to illustrate the contents of the disclosure.

DETAILED DESCRIPTION

Figure 1:
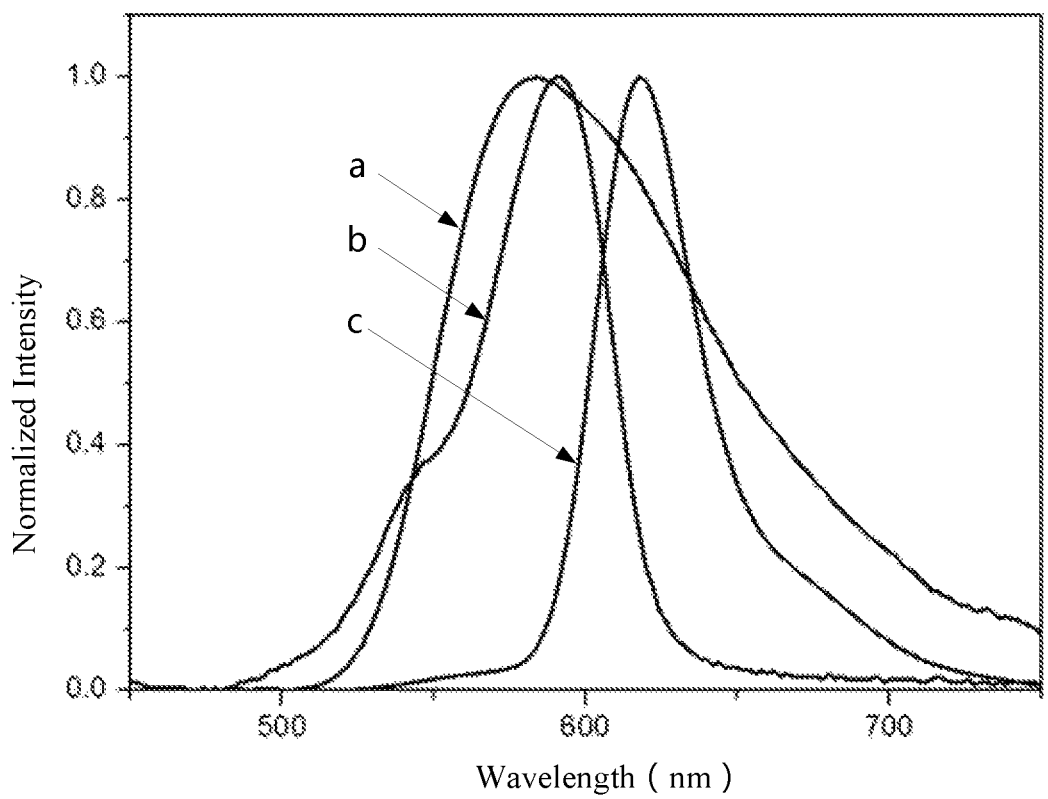
FIG. 1 illustrates a spectrogram of a TADF material and a fluorescent guest material of an emitting layer of the organic electroluminescent device of some illustrative embodiments.

Those of ordinary skill in the art should understand that modification or equivalent replacement can be made to the technical solution of the disclosure without departing from the spirit and scope of the technical solution of the disclosure, and should fall within the scope of the claims of the disclosure.

In the accompanying drawings, the size of a constituent element and the thickness or the area of a layer are sometimes exaggerated for clarity. Therefore, implementation manners of the disclosure are not necessarily limited to the sizes, and the shapes and sizes of each part in the accompanying drawings do not reflect the true scale. In addition, the accompanying drawings schematically show some examples, and the implementation manners of the disclosure are not limited to the shapes or numerical values shown in the accompanying drawings.

A TADF material is a third generation organic luminescent material developed after an organic fluorescent material and a phosphorescent material, which has been developed rapidly in recent years and has good application potential in the technology of OLEDs. The TADF material has a small lowest singlet state-lowest triplet state energy difference ($\Delta E_{ST}$). The lowest triplet state (T1) excitons may be transformed into lowest singlet state (S1) excitons by Reverse Intersystem Crossing (RISC), and fluorescence emission is realized by the radiation transition from the lowest singlet state (S1) excitons to a ground state (S0), so as to achieve 100% internal quantum efficiency in theory. A TADF sensitizer-based super-fluorescence technology is considered to be an implementation solution of the TADF material in the technology of OLEDs. However, at present, OLED devices using the TADF material face many problems to hinder its practical application. For example: (1) in order to prevent the diffusion of triplet state excitons in the emitting layer, a hole blocking layer material and an electron blocking layer material with high T1 will be matched on two sides of the emitting layer, which causes a limitation to the selection of the material of a corresponding film and reduces the flexibility of device design; and (2) the emitting layer has charge traps, which results in high working voltage and high power consumption of the devices.

The embodiments of the disclosure provide an organic electroluminescent device, including an anode, a cathode, an emitting layer arranged between the anode and the cathode, and an assistant luminescent layer located on one side, facing the anode, of the emitting layer. The assistant luminescent layer includes a first host material and a first fluorescent guest material. The emitting layer includes a second host material, a TADF material, and a second fluorescent guest material.

According to the organic electroluminescent device of the embodiments of the disclosure, the assistant luminescent layer is arranged on one side, facing the anode, of the emitting layer. Thus, in some possible implementation manners, the assistant luminescent layer may be arranged between an electron blocking layer and the emitting layer. The first host material of the assistant luminescent layer may be set to have high hole transport capacity and capacity of blocking the leakage of the triplet state excitons in the emitting layer. Thus, it is not necessary to require the material of the electron blocking layer to have high triplet state energy to block the leakage of the triplet state excitons in the emitting layer, which can improve the flexibility of the selection of the material of the electron blocking layer. In addition, since the emitting layer is a super-fluorescence system, the hole transport capacity of the second host material in the emitting layer is stronger than the hole transport capacity of the TADF material. After the assistant luminescent layer is arranged, the assistant luminescent layer may be set to be a material that does not have a material with the properties of TADF, or the dopant concentration (may be mass percentage) of the material with the properties of the TADF contained in the assistant luminescent layer is less than the dopant concentration of the TADF material in the emitting layer. Thus, the hole transport impedance between the electron blocking layer and the emitting layer may be reduced, and holes may be transported to the emitting layer better, so that the working voltage of the device can be reduced.

Herein, for ease of description, the first host material may be called material B for short, the first fluorescent guest material may be called material C for short, the second host material may be called material D for short, the TADF material may be called material E for short, and the second fluorescent guest material may be called material F for short.

The highest occupied molecular orbital energy level of the material is called a HOMO energy level for short, and the lowest occupied molecular orbital energy level of the material is called a LUMO energy level for short. The lowest singlet state energy of the material is called S1 energy for short, and the lowest triplet state energy is called T1 energy for short.

The lowest singlet state energy of the first host material is S1 (B), and the lowest triplet state energy is T1 (B). The lowest singlet state energy of the first fluorescent guest material is S1 (C), and the lowest triplet state energy is T1 (C). The lowest singlet state energy of the second host material is S1 (D), and the lowest triplet state energy is T1 (D). The lowest singlet state energy of the TADF material is S1 (E), and the lowest triplet state energy is T1 (E). The lowest singlet state energy of the second fluorescent guest material is S1 (F), and the lowest triplet state energy is T1 (F).

The HOMO energy of the first host material is HOMO (B), and the LUMO energy level is LUMO (B). The HOMO energy of the first fluorescent guest material is HOMO (C), and the LUMO energy level is LUMO (C). The HOMO energy of the second host material is HOMO (D), and the LUMO energy level is LUMO (D). The HOMO energy of the TADF material is HOMO (E), and the LUMO energy level is LUMO (E). The HOMO energy of the second fluorescent guest material is HOMO (F), and the LUMO energy level is LUMO (F).

Herein, the electro emission spectrum of a material refers to the luminescence spectrum obtained in an electrified state by doping the material in a certain proportion (for example, 20%) into the host material to prepare an OLED device. If the host material is in an exciplex form containing two components, the descriptions for S1 and T1 of the host material refer to S1 and T1 of an exciplex. If the host material is in an exciplex form, the descriptions for HOMO and LUMO of the host material respectively refer to HOMO with a smaller absolute value and LUMO a larger absolute value of the two components forming an exciplex.

In some illustrative embodiments, in the assistant luminescent layer, the first host material may be a hole type material. The hole mobility of the first host material may be at least ten times higher than the electron mobility. For example, the first host material may be carbazole materials. The first host material does not have the properties of the TADF, i.e., the first host material satisfies: $S1(B)-T1(B)>0.2$ eV.

The first fluorescent guest material may be a common fluorescent material, such as anthracenes, fluorenes, pyrenes, pyrroles, or boron-containing materials with multiple resonance effects. The dopant concentration of the first fluorescent guest material may be 0.5 to 10%, i.e., the first fluorescent guest material accounts for 0.5 to 10% of the assistant luminescent layer by mass.

The first host material and the first fluorescent guest material satisfy:

$S1(B)>S1(C)$;

$T1(B)>T1(C)$;

$||HOMO(B)-LUMO(C)|-S1(C)|\leq 0.2$ eV.

In the present embodiment, the assistant luminescent layer satisfies the abovementioned conditions. The first host material in the assistant luminescent layer may achieve an effect of diffusing the first fluorescent guest material, a hole transport effect, and an effect of blocking the triplet state excitons in the emitting layer. Thus, it does not require the material of an electron blocking layer to have high triplet state energy to block the triplet state excitons in the emitting layer in a case where the device also includes the electron blocking layer, which can improve the flexibility of the selection of the material of the electron blocking layer. In addition, in the embodiments of the disclosure, the excitons are mainly generated from the TADF material of the emitting layer, and the first host material does not have the properties of TADF, thus, the first host material will not compete for the excitons with the emitting layer, and will not lose the effect of blocking the triplet state excitons. In addition, the first host material and the first fluorescent guest material will not form the exciplex, which will not consume a large amount of charge in the emitting layer, so as not to affect the efficiency of the device and cause the red shift of an emitting color of the device.

In some illustrative embodiments, the assistant luminescent layer may consist of two components, i.e., the first host material and the first fluorescent guest material. The assistant luminescent layer may not contain the material with the properties of the TADF; or, the assistant luminescent layer contains the material with the properties of the TADF, and the dopant concentration (may be mass percentage) of the material with the properties of the TADF is less than the dopant concentration of the TADF material in the emitting layer. The assistant luminescent layer may be formed by dual-source co-evaporation. The thickness of the assistant luminescent layer may be 1 nm to 10 nm, for example, the thickness may be 8 nm.

In some illustrative embodiments, in the emitting layer, the second host material may be a single-component material (such as carbazole), or a mixed material with the properties of the exciplex (such as "carbazole+triazine", "carbazole+pyridine", or "carbazole+oxadiazole"). When the second host material is a single-component material, the second host material may satisfy: S1(D)–T1(D)>0.2 eV. The hole mobility of the second host material may be at least ten times higher than the electron mobility.

The TADF material satisfies: $\Delta E_{ST}(E) = S1(E) - T1(E) < 0.2$ eV. The materials that may be selected for the TADF material include, but are not limited to, triazines, pyridines, ketones, quinones, etc. with small $\Delta E_{ST}$. The proportion (may be mass percentage) of the TADF material in the emitting layer is X, and 5%<X<50%. For example, 15%<X<40%.

The second fluorescent guest material may be a common fluorescent material, such as anthracenes, fluorenes, pyrenes, or pyrroles. Or, the second fluorescent guest material may be boron-containing materials with multiple resonance TADF properties, S1(F)–T1(F)<0.2 eV. The dopant concentration of the second fluorescent guest material may be 0.5 to 5%, i.e., the second fluorescent guest material accounts for 0.5 to 5% of the emitting layer by mass, which facilitates the reduction of the probability of the second fluorescent guest material capturing the excitons, and facilitates the formation of the excitons mainly in the TADF material.

The second host material, the TADF material, and the second fluorescent guest material may satisfy:

$S1(D) > S1(E) > S1(F)$;

$T1(D) > T1(E) > T1(F)$;

|HOMO(D)–HOMO(E)|<0.2 eV;

|LUMO(D)–LUMO(E)|>0.3 eV;

||HOMO(D)–LUMO(E)|–S1(E)|≤0.2 eV;

||HOMO(D)–LUMO(E)|–T1(E)|≤0.2 eV.

An absorption spectrum of the second fluorescent guest material may greatly overlap with an emission spectrum (may be an electroluminescence spectrum) of the TADF material. Under a normalization condition, an overlapping area of the absorption spectrum of the second fluorescent guest material and the emission spectrum of the TADF material is not less than 70% of an area of the absorption spectrum of the second fluorescent guest material; and A peak position difference between a lowest energy absorption peak of the absorption spectrum of second fluorescent guest material and a highest energy emission peak of the emission spectrum of the TADF material may be not greater than 20 nm. Thus, the larger the overlapping area of the absorption spectrum of the second fluorescent guest material and the emission spectrum of the TADF material, the more conducive for the TADF material to transfer energy to the second fluorescent guest material in a Forster energy transfer manner to enable the second fluorescent guest material to emit light.

In the present embodiment, the emitting layer satisfies the abovementioned condition, holes in the second host material may be transported to the TADF material better. The TADF material, serving as an electron trap of the second host material, helps to form excitons mainly in the TADF material, and may ensure that the TADF material can transfer energy to the second fluorescent guest material after the excitons are generated, so as to enable the second fluorescent guest material to emit light. It can be understood that the TADF material is a sensitizer of the second fluorescent guest material. In addition, the second host material and the TADF material cannot form an exciplex.

In some illustrative embodiments, in the emitting layer, the second host material, the TADF material, and the second fluorescent guest material may also satisfy: $\lambda(D) > \lambda(E) > \lambda(F)$, herein $\lambda(D)$ represents the strongest emission peak wavelength of the second host material; $\lambda(E)$ represents the strongest emission peak wavelength of the TADF material; and the $\lambda(F)$ represents the strongest emission peak wavelength of the second fluorescent guest material. Thus, the direction conducive to transferring energy in the emitting layer is to flow to the second fluorescent guest material, which is conducive to improving the device efficiency.

In some illustrative embodiments, the first host material in the assistant luminescent layer is the same as or different from the second host material in the emitting layer, and the first fluorescent guest material in the assistant luminescent layer is the same as or different from the second fluorescent guest material in the emitting layer.

When first host material is different from second host material, the following condition is satisfied.

|HOMO(B)–HOMO(D)|<0.2 eV;

|HOMO(B)–HOMO(E)|<0.2 eV;

$T1(B) > T1(E)$, for example, $T1(B) - T1(E) > 0.2$ eV;

||HOMO(B)–LUMO(E)|–S1(E)|≤0.2 eV;

||HOMO(B)–LUMO(E)|–T1(E)|≤0.2 eV.

In the present embodiment, the first host material is different from the second host material, and satisfies the abovementioned conditions. Thus, it can ensure that holes can enter the emitting layer more efficiently from the first host material, and the first host material achieves a good effect of blocking triplet state excitons. In addition, the first host material in the assistant luminescent layer and the TADF material in the emitting layer cannot form an exciplex, which can prevent competing for the excitons with the emitting layer.

When the first fluorescent guest material is different from the second fluorescent guest material, the following conditions are satisfied: the emission spectrum of the first fluorescent guest material is close to the emission spectrum of the second fluorescent guest material, and the peak position difference may be less than 5 nm. Under a normalization condition, an overlapping area of the emission spectrum of the first fluorescent guest material and the emission spectrum of the second fluorescent guest material may be greater than 90% of an area of the emission spectrum of the first fluorescent guest material, and may be greater than 90% of an area of the emission spectrum of the second fluorescent guest material. The absorption spectrum of the first fluorescent guest material may greatly overlap with the emission spectrum (may be an electroluminescence spectrum) of the TADF material. Under a normalization condition, an overlapping area of the spectrum may be not less than 70% of an area of the absorption spectrum of the first fluorescent guest material. Thus, the TADF material in the emitting layer may transfer energy to the first fluorescent guest material and the second fluorescent guest material in a Forster energy transfer manner to enable the first fluorescent guest material and the second fluorescent guest material to emit light. It can be understood that the TADF material is a sensitizer of the second fluorescent guest material, and is a sensitizer of the first fluorescent guest material. The overlapping degree of the emission spectra of the first fluorescent guest material and the second fluorescent guest material is high, so that the purity of an emitting color of the device can be ensured. In addition, the first fluorescent guest material participates in luminescence and is located at a different layer with the TADF material, so that the physical separation of an exciton recombination center and a luminescence center can be realized, which is conducive to improving the performance of the device. The emitting colors of the first fluorescent guest material and the second fluorescent guest material may be any color, for example, red, green, or blue and the like.

In some illustrative embodiments, the emitting layer may consist of the second host material, the TADF material, and the second fluorescent guest material. The emitting layer may be formed by multi-source co-evaporation.

In some illustrative embodiments, the thickness of the emitting layer may be 10 nm to 30 nm. The thickness of the emitting layer is at least twice that of the assistant luminescent layer, i.e., the ratio of the thickness of the emitting layer to the thickness of the assistant luminescent layer is greater than 2:1.

In some illustrative embodiments, the organic electroluminescent device further includes an electron blocking layer arranged on one side, facing the anode, of the assistant luminescent layer.

In an example of the present embodiment, the material of the electron blocking layer and the first host material may satisfy: |HOMO(A)−HOMO(B)|≤0.2 eV, |LUMO(B)|−|LUMO(A)|>0.2 eV, herein HOMO (A) represents the highest occupied molecular orbital energy level of the material of the electron blocking layer, and LUMO (A) represents the lowest occupied molecular orbital energy level of the material of the electron blocking layer. Thus, holes may be transferred to the assistant luminescent layer from the electron blocking layer better, and can suppress electron transfer.

In some illustrative embodiments, the organic electroluminescent device may further include a hole blocking layer arranged on one side, facing the cathode, of the emitting layer.

In an example of the present embodiment, the T1 energy of the material of the hole blocking layer may be greater than the T1 energy of the TADF material in the emitting layer, and the difference between the two may be greater than 0.2 eV. Thus, the hole blocking layer may achieve an effect of blocking the leakage of triplet state excitons in the emitting layer. The absolute value of the HOMO energy level of the material of the hole blocking layer may be 0.2 eV greater than the absolute value of the HOMO energy level of the second host material in the emitting layer. The thickness of the hole blocking layer may be 5 nm to 30 nm, and the hole blocking layer may be formed by an evaporation process.

In some illustrative embodiments, the organic electroluminescent device further includes a hole inject layer and a hole transport layer arranged between the anode and the electron blocking layer. The hole inject layer, the hole transport layer, and the electron blocking layer may be stacked on the anode in turn.

In an example of the present embodiment, the hole transport layer may be formed by a material with good hole transport capability, such as aromatic amine or carbazole materials. The absolute value of the HOMO energy level difference between the material of the hole transport layer and the material of the electron blocking layer may be not greater than 0.2 eV. The thickness of the hole transport layer may be 1 nm to 200 nm, and the hole transport layer may be formed by an evaporation process.

The hole inject layer may be formed by the material such as CuPc (copper phthalocyanine), HATCN (2,3,6,7,10,11-hexacyano-1,4,5,8,9,12-hexaazaphenanthrene) or $MnO_3$ (manganese anhydride), or performing p-type doping in the hole transport material. The thickness of the hole inject layer may be 1 nm to 30 nm, and may be formed by evaporation.

In some illustrative embodiments, the organic electroluminescent device may further include an electron inject layer and an electron transport layer arranged between the cathode and the hole blocking layer. The electron inject layer and the electron transport layer may be stacked on the hole blocking layer in turn.

In an example of the present embodiment, the electron transport layer may be formed by evaporation of an electron transport type material with good electron transport capacity, or formed by doping the materials, such as $LIQ_3$, Li (Lithium), and Ca (Calcium), in an electron transport type material. The thickness of the electron transport layer may be 10 nm to 70 nm.

The electron inject layer may be formed by metals with low work function, such as Li, Ca or Yb (ytterbium), or by metal salt materials such as LiF (lithium fluoride) or $LiQ_3$ through evaporation. The thickness of the electron inject layer may be 0.5 nm to 2 nm.

In some illustrative embodiments, the cathode may be formed by the metal with relatively low work function, such as Al, Ag, and Mg, or formed by an alloy containing a metal material with a low work function. When the organic electroluminescent device is a bottom emitting device, the thickness of the cathode may be greater than 80 nm, so as to ensure good reflectivity (for example, the reflectivity of light with a wavelength of 550 nm may be greater than 85%). When the organic electroluminescent device is a top emitting device, the thickness of the cathode may be 10 nm to 20 nm, so as to ensure certain transmittance (for example, the transmittance of light with a wavelength of 550 nm may be greater than 45%).

In some illustrative embodiments, the organic electroluminescent device may further include an optical capping layer (called CPL for short) arranged on a surface, deviating from the emitting layer, of the cathode, so as to improve optical output. The CPL is formed by performing evaporation on an organic small molecular material with the refractive index of greater than 1.8, and the thickness of the CPL may be 50 nm to 100 nm.

In some illustrative embodiments, the anode may be a material with a high work function. Illustratively, for the bottom emitting device, the anode may adopt a transparent oxide material such as indium tin oxide (ITO) or indium zinc oxide (IZO), and the thickness may be 80 nm to 200 nm. Or, for the top emitting device, the anode may adopt a composite structure of a metal or a transparent oxide, such as Ag/ITO, Ag/IZO, Al/ITO, Al/IZO, or ITO/AG/ITO, so as to ensure good reflectivity. The thickness of a metal layer in the anode may be 10 nm to 100 nm, and the thickness of an oxide layer may be 5 nm to 20 nm.

Figure 2:
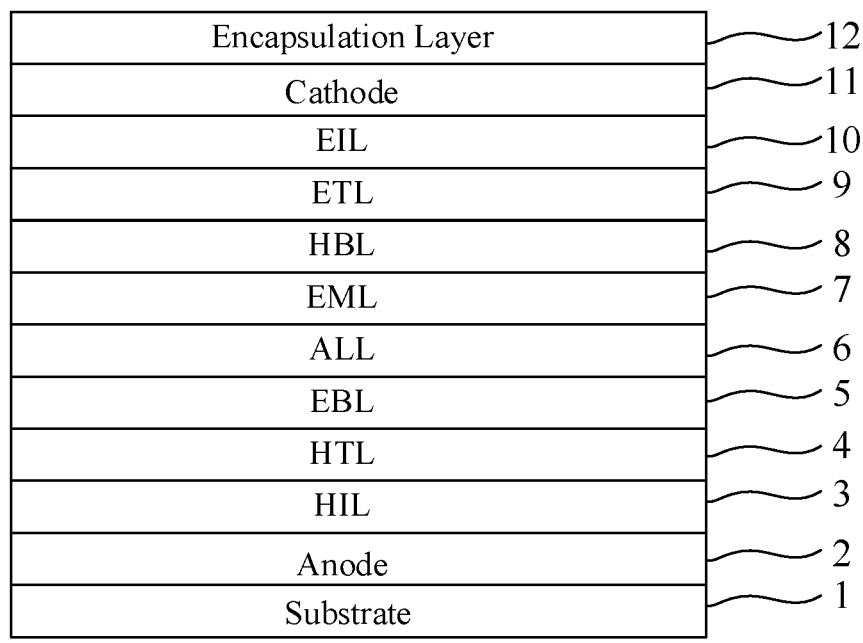
FIG. 2 is a structural schematic diagram of the organic electroluminescent device of some illustrative embodiments.

In some illustrative embodiments, as shown in FIG. 2, the organic electroluminescent device may include an anode 2, a Hole Injection Layer (HIL) 3, a Hole Transport Layer (HTL) 4, an Electron Blocking Layer (EBL) 5, an assistant luminescent layer (called ALL for short) 6, an Emitting Layer (EML) 7, a Hole Blocking Layer (HBL) 8, an Electron Transfer Layer (ETL) 9, an Electron Injection Layer (EIL) 10, and a cathode 11 stacked on the substrate 1 in turn. The organic electroluminescent device may further include an encapsulation layer 12 arranged on one side, deviating from the substrate 1, of the cathode 11. The encapsulation layer 12 achieves an effect of protecting.

In some illustrative embodiments, the organic electroluminescent device may be a top emitting device. The thickness of an organic layer between the cathode and the anode may be designed to meet a requirement on an optical path of an optical micro-resonator, so as to obtain better light output intensity and required color. The internal optical path of the top emitting device may be adjusted by changing the thickness of the hole transport layer or the thickness of the electron blocking layer.

The performance of the organic electroluminescent devices of some illustrative embodiments of the disclosure is tested and compared.

Device 1 (Comparative Example): Ag(100 nm)/ITO(8 nm)/HIL/HTL/EBL-1/TM:TH:RD (25 nm, 70%: 29.3%:0.7%)/HBL/ETL/EIL(1 nm)/Mg:Ag(15 nm)/CPL Device 2 (Comparative Example): Ag(100 nm)/ITO(8 nm)/HIL/HTL/EBL-2/TM:TH:RD (25 nm, 70%: 29.3%:0.7%)/HBL/ETL/EIL(1 nm)/Mg:Ag(15 nm)/CPL Device 3 (Embodiment): Ag(100 nm)/ITO(8 nm)/HIL/HTL/EBL-2/TM:RD(3 nm, 1%)/TM:TH:RD (22 nm, 70%:29.3%:0.7%)/HBL/ETL/EIL(1 nm)/Mg:Ag(15 nm)/CPL Device 4 (Embodiment): Ag(100 nm)/ITO(8 nm)/HIL/HTL/EBL-1/TM: RD(3 nm, 1%)/TM:TH:RD (22 nm, 70%:29.3%:0.7%)/HBL/ETL/EIL(1 nm)/Mg:Ag(15 nm)/CPL Device 5 (Embodiment): Ag(100 nm)/ITO(8 nm)/HIL/HTL/EBL-1/TM: RD(6 nm, 1%)/TM:TH:RD (19 nm, 70%:29.3%:0.7%)/HBL/ETL/EIL(1 nm)/Mg:Ag(15 nm)/CPL In the abovementioned five devices, Device 1 and Device 2 are devices of comparative examples, and Device 3, Device 4, and Device 5 are the devices of three illustrative embodiments of the disclosure. TM is a host material of the assistant luminescent layer and the emitting layer (i.e., the first host material of the assistant luminescent layer and the second host material of the emitting layer are both TM). TH is two materials with the properties of the TADF (both materials may have the properties of the TADF); RD is a common red fluorescent guest material; and EBL-1 and EBL-2 are respectively hole transport type materials. Taking Device 3 as an example, the thickness of the assistant luminescent layer is 3 nm. The dopant concentration of the RD in the assistant luminescent layer is 1%. The thickness of the emitting layer is 22 nm. The TM, the TH, and the RD respectively account for 70%, 29.3%, and 0.7% of the emitting layer. Molecular energy orbits and excited state information of the abovementioned materials are shown in Table 1. The emission spectrum of the TH, the absorption spectrum and the emission spectrum of the RD are as shown in FIG. 1. In FIG. 1, curve a represents electroluminescent emission spectrum of the TH, curve b represents the absorption spectrum of the RD, and curve c represents the electroluminescent emission spectrum of the RD. The performance of the abovementioned five devices are as shown in Table. 2. In Table. 2, LT95 lifetime of Device 2 to Device 5 (referring to the luminescence time length from of the brightness of the light emitted from the device to decay to 95% of the initial brightness) is the ratio of the LT95 lifetime of each of Devices 2 to 5 to the LT95 lifetime of Device 1, based on the LT95 lifetime of the Device 1.

TABLE 1

Molecular Energy Orbital and Excited State of Materials

|  | HOMO (eV) | LUMO (eV) | T1 (eV) | S1 (eV) |
| --- | --- | --- | --- | --- |
| TM | −5.8 | −2.6 | 2.70 | 3.48 |
| TH | −5.9 | −3.6 | 2.35 | 2.43 |
| RD | −5.6 | −3.6 | Not detected | 2.03 |
| EBL-1 | −5.7 | −2.5 | 2.61 | / |
| EBL-2 | −5.6 | −2.3 | 2.53 | / |

TABLE 2

Performance of Device

|  | Current density (mA/cm$^2$) | Voltage (V) | Efficiency (cd/A) | Chromaticity Coordinates (CIE-1931) | LT95 Lifetime (Relative value) |
| --- | --- | --- | --- | --- | --- |
| Device 1 | 10 | 4.27 | 47.2 | 0.667, 0.333 | 100% |
| Device 2 | 10 | 4.39 | 38.1 | 0.666, 0.334 | 117% |
| Device 3 | 10 | 4.12 | 46.0 | 0.666, 0.334 | 109% |
| Device 4 | 10 | 4.02 | 45.7 | 0.667, 0.333 | 95% |
| Device 5 | 10 | 4.01 | 45.4 | 0.667, 0.333 | 90% |

With regard to Device 1 and Device 2 of a comparative example, the device structures of Device 1 and Device 2 are both common super-fluorescent bottom emitting devices, the difference between the two is the material of the electron blocking layer, and the rest is the same. It can be seen from Table 1 and Table 2 that: EBL-1 and EBL-2 have similar HOMO energy level and LUMO level, but T1 of EBL-2 is small, which easily causes the leakage of the triplet state excitons in the emitting layer, so that the efficiency of Device 2 is obviously reduced compared with that of the Device 1. The lifetime of Device 2 is prolonged compared with Device 1, which is mainly because EBL-2 has a shallower HOMO energy level compared with EBL-1. Thus, the potential barrier formed near an interface between the electron blocking layer and the emitting layer helps to slow down the injection of holes into the emitting layer, so as to form better carrier balance.

With respect to Device 3, Device 4, and Device 5 of the embodiments of the disclosure, each of Device 3, Device 4, and Device 5 includes an assistant luminescent layer and an emitting layer. It can be seen from Table 1 and Table 2 that:

compared with Device 1, Device 3 includes an assistant luminescent layer. The assistant luminescent layer can block the triplet state excitons in the emitting layer, so the efficiency of Device 3 is not sensitive to T1 of the electron blocking layer. Although Device 3 uses EBL-2 with low T1, it still maintains good efficiency and lifetime. In addition, since Device 3 is provided with the assistant luminescent layer, the hole transport impedance between the electron blocking layer and the emitting layer can be reduced, and the holes can be transported to the emitting layer better. Therefore, the voltage of Device 3 is significantly reduced.

Compared with Device 1, since both Device 4 and Device 5 are provided with the assistant luminescent layer, the hole transport impedance between the electron blocking layer and the emitting layer can be reduced, and the holes can be transported to the emitting layer better. Therefore, Device 4 and Device 5 have lower working voltage and maintain good efficiency. In addition, when the thickness of the assistant luminescent layer is improved from 3 nm to 6 nm, the lifetime of the devices is shortened.

In conclusion, according to the organic electroluminescent device of the embodiments of the disclosure, the assistant luminescent layer is arranged on one side, facing the anode, of the emitting layer, and reasonable material selection and material energy level matching are performed on the assistant luminescent layer and the emitting layer, so that the organic electroluminescent device of the embodiments of the disclosure can realize lower working voltage and has great flexibility on the selection of the material of the electron blocking layer under the condition of ensuring good efficiency and lifetime compared with a device with a single emitting layer structure.

The embodiments of the disclosure further provide a display apparatus, including the organic electroluminescent device as described in any one of the foregoing embodiments.

In some illustrative embodiments, the display substrate includes a display area. The display area includes a plurality of organic electroluminescent devices arranged in an array. In a direction perpendicular to the display substrate, the display panel may include a driving circuit layer arranged on the substrate, an emitting structure layer arranged on one side, far away from the substrate, of the driving circuit layer, and an encapsulation structure layer arranged on one side, far away from the substrate, of the emitting structure layer. The driving circuit layer includes a pixel driving circuit. The pixel driving circuit includes a thin film transistor and a storage capacitor. The emitting structure layer includes a plurality of organic electroluminescent devices. The anode of each organic electroluminescent device is connected to a drain electrode of the thin film transistor of the corresponding pixel driving circuit. The encapsulation structure layer may adopt the manners of UV glue encapsulation, thin film encapsulation, and the like. For example, the encapsulation structure includes a first encapsulation layer, a second encapsulation layer, and a third encapsulation layer stacked in turn. The first encapsulation layer and the third encapsulation layer may be made of an inorganic material. The second encapsulation layer may be made of an organic material. The encapsulation structure layer may ensure that external water vapor cannot enter a display area. The substrate may be a flexible substrate or a rigid substrate, such as polyimide, glass, sapphire or silicon wafer and the like. If a bottom emitting device is designed, the transmittance of the substrate to light with a wavelength of 550 nm may be greater than 85%. The display substrate may further include other film layers, such as a spacer column and the like, which is not limited by the disclosure herein.

The embodiments of the disclosure further provide a display apparatus, including the organic electroluminescent device as described in any one of the foregoing embodiments. The display apparatus may be any product or part with a display function, such as a mobile phone, a tablet computer, a television, a display, a notebook computer, a digital photo frame, a navigator, a vehicle-mounted display, an intelligent watch, and an intelligent bracelet and the like.

Although the implementation manners disclosed by the present disclosure are stated above, the content is only the implementation manners adopted for the convenience of understanding the present disclosure and is not used to limit the present disclosure. Any person skilled in the art of the disclosure can make any modification and change in the forms and details of implementation without departing from the spirit and scope disclosed in the disclosure. However, the scope of protection of the patent of the disclosure shall still be host to the scope defined in the attached claims.

The invention claimed is:

1. An organic electroluminescent device, comprising an anode, a cathode, an emitting layer arranged between the anode and the cathode, and an assistant luminescent layer located on one side, facing the anode, of the emitting layer, wherein the assistant luminescent layer comprises a first host material and a first fluorescent guest material;

the emitting layer comprises a second host material, a TADF material, and a second fluorescent guest material; and the first host material and the first fluorescent guest material satisfy:

$S1(B)-T1(B)>0.2$ eV;

$S1(B)>S1(C)$;

$T1(B)>T1(C)$;

$||HOMO(B)-LUMO(C)|-S1(C)|\leq 0.2$ eV, wherein the lowest singlet state energy of the first host material is S1(B), and the lowest triplet state energy is T1(B);

the lowest singlet state energy of the first fluorescent guest material is S1(C), and the lowest triplet state energy is T1(C); and the highest occupied molecular orbital energy level of the first host material is HOMO (B); and the lowest occupied molecular orbital energy level of the first fluorescent guest material is LUMO (C).

2. The organic electroluminescent device according to claim 1, wherein the first host material is a hole type material; and the hole mobility of the first host material is at least ten times higher than the electron mobility.

3. The organic electroluminescent device according to claim 1, wherein the assistant luminescent layer does not contain a material with a TADF characteristic.

4. The organic electroluminescent device according to claim 1, wherein the second host material, the TADF material, and the second fluorescent guest material satisfy:

$S1(E)-T1(E)<0.2$ eV;

$S1(D)>S1(E)>S1(F)$;

$T1(D)>T1(E)>T1(F)$;

$|HOMO(D)-HOMO(E)|<0.2$ eV;

$|LUMO(D)-LUMO(E)|>0.3$ eV;

$||HOMO(D)-LUMO(E)|-S1(E)|\leq 0.2$ eV;

$||HOMO(D)-LUMO(E)|-T1(E)|\leq 0.2$ eV, wherein:

the lowest singlet state energy of the second host material is S1(D), and the lowest triplet state energy is T1(D);

the lowest singlet state energy of the TADF material is S1(E), and the lowest triplet state energy is T1(E);

the lowest singlet state energy of the second fluorescent guest material is S1(F), and the lowest triplet state energy is T1(F);

the highest occupied molecular orbital energy level of the second host material is HOMO (D), and the lowest occupied molecular orbital energy level is LUMO (D); and the highest occupied molecular orbital energy level of the TADF material is HOMO (E), and the lowest occupied molecular orbital energy level is LUMO (E).

5. The organic electroluminescent device according to claim 4, wherein an overlapping area of the absorption spectrum of the second fluorescent guest material and the emission spectrum of the TADF material is not less than 70% of an area of the absorption spectrum of the second fluorescent guest material; and a peak position difference between a lowest energy absorption peak of the absorption spectrum of the second fluorescent guest material and a highest energy emission peak of the emission spectrum of the TADF material is not greater than 20 nm.

6. The organic electroluminescent device according to claim 4, wherein the second host material is a single-component material, or a mixed material with the properties of an exciplex;

when the second host material is a single-component material, the second host material satisfies: S1(D)−T1 (D) >0.2 eV; and the hole mobility of the second host material is at least ten times higher than the electron mobility.

7. The organic electroluminescent device according to claim 4, wherein the second host material, the TADF material, and the second fluorescent guest material further satisfy: λ(D)λ>(E)>λ(F), wherein λ(D) represents the strongest emission peak wavelength of the second host material;

λ(E) represents the strongest emission peak wavelength of the TADF material; and λ(F) represents the strongest emission peak wavelength of the second fluorescent guest material.

8. The organic electroluminescent device according to claim 4, wherein the emitting layer consists of the second host material, the TADF material, and the second fluorescent guest material.

9. The organic electroluminescent device according to claim 1, wherein the first host material is the same as or different from the second host material;

when the first host material is different from the second host material, the following condition is satisfied:

|HOMO(*B*)−HOMO(*D*)|<0.2 eV;

|HOMO(*B*)−HOMO(*E*)|<0.2 eV;

*T*1(*B*)>*T*1(*E*);

||HOMO(*B*)−LUMO(*E*)|−*S*1(*E*)|≤0.2 eV;

HOMO(*B*)−LUMO(*E*)|−*T*1(*E*)|≤0.2 eV, wherein the highest occupied molecular orbital energy level of the first host material is HOMO (B);

the highest occupied molecular orbital energy level of the second host material is HOMO (D);

the highest occupied molecular orbital energy level of the TADF material is HOMO (E), and the lowest occupied molecular orbital energy level is HOMO (E);

the lowest triplet state energy of the first host is T1(B); and the lowest singlet state energy of the TADF material is S1(E), and the lowest triplet state energy is T1(E).

10. The organic electroluminescent device according to claim 1, wherein the first fluorescent guest material is the same as or different from the second fluorescent guest material; and when the first fluorescent guest material is different from the second fluorescent guest material, the following conditions are satisfied:

an overlapping area of the emission spectrum of the first fluorescent guest material and the emission spectrum of the second fluorescent guest material is greater than 90% of an area of the emission spectrum of the first fluorescent guest material, and is greater than 90% of an area of the emission spectrum of the second fluorescent guest material; and an overlapping area of the absorption spectrum of the first fluorescent guest material and the emission spectrum of the TADF material is not less than 70% of an area of the absorption spectrum of the first fluorescent guest material.

11. The organic electroluminescent device according to claim 1, further comprising an electron blocking layer arranged on one side, facing the anode, of the assistant luminescent layer; wherein the material of the electron blocking layer and the first host material satisfy the following conditions:

|HOMO(*A*)−HOMO(*B*)|≤0.2 eV,|LUMO(*B*)|−|LUMO (*A*)|>0.2 eV, wherein

HOMO (A) represents the highest occupied molecular orbital energy level of the material of the electron blocking layer, and LUMO (A) represents the lowest occupied molecular orbital energy level of the material of the electron blocking layer.

12. The organic electroluminescent device according to claim 11, further comprising a hole inject layer and a hole transport layer arranged between the anode and the electron blocking layer.

13. The organic electroluminescent device according to claim 1, further comprising a hole blocking layer arranged on one side, facing the cathode, of the emitting layer; wherein the lowest triplet state energy of the material of the hole blocking layer is greater than the lowest triplet state energy of the TADF material; and an absolute value of the highest occupied molecular orbital energy level of the material of the hole blocking layer is over 0.2e greater than the absolute value of the highest occupied molecular orbital energy level of the second host material.

14. The organic electroluminescent device according to claim 13, further comprising an electron inject layer and an electron transport layer arranged between the cathode and the hole blocking layer.

15. The organic electroluminescent device according to claim 1, wherein the TADF material accounts for X of the emitting layer by mass, and 5%<X<50%.

16. The organic electroluminescent device according to claim 1, wherein the second guest material accounts for 0.5 to 5% of the emitting layer by mass.

17. The organic electroluminescent device according to claim 1, wherein the thickness of the emitting layer is at least twice greater than that of the assistant luminescent layer.

18. The organic electroluminescent device according to claim 1, wherein the thickness of the emitting layer is 10 nm to 30 nm.

19. The organic electroluminescent device according to claim 1, wherein the thickness of the assistant luminescent layer is 1 nm to 10 nm.

20. A display apparatus, comprising the organic electroluminescent device according to claim 1.

* * * * *